(12) United States Patent
Nishikawa et al.

(10) Patent No.: US 8,958,100 B2
(45) Date of Patent: Feb. 17, 2015

(54) IMAGE PROCESSING APPARATUS, INFORMATION PROCESSING APPARATUS, AND IMAGE PROCESSING METHOD FOR PROCESSING A PRINT JOB TRANSMITTED FROM THE INFORMATION PROCESSING APPARATUS TO THE IMAGE FORMING APPARATUS VIA COMMUNICATION PROTOCOL

(71) Applicants: Naoki Nishikawa, Nagoya (JP); Takanobu Suzuki, Nagoya (JP)

(72) Inventors: Naoki Nishikawa, Nagoya (JP); Takanobu Suzuki, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 13/833,236

(22) Filed: Mar. 15, 2013

(65) Prior Publication Data
US 2014/0063537 A1 Mar. 6, 2014

(30) Foreign Application Priority Data
Sep. 3, 2012 (JP) ................................. 2012-193091

(51) Int. Cl.
*G06K 15/00* (2006.01)
*G06F 3/12* (2006.01)
(Continued)

(52) U.S. Cl.
CPC ............... *G06F 3/1236* (2013.01); *G03F 3/00* (2013.01); *H04M 1/7253* (2013.01);
(Continued)

(58) Field of Classification Search
CPC ....................................................... G06F 3/12
USPC .......... 358/1.15, 1.14, 3.24, 1.6, 1.9; 370/475, 370/469, 395.5, 395.52, 395.53; 455/41.3, 455/41.2, 41.1, 39, 552.1, 517, 437, 421, 455/403, 3.05; 710/231, 11, 14, 20, 105, 710/106, 301
See application file for complete search history.

(56) References Cited

U.S. PATENT DOCUMENTS

2005/0088709 A1  4/2005  Kizaki et al.
2007/0230332 A1  10/2007  Fukasawa
(Continued)

FOREIGN PATENT DOCUMENTS

JP  2007166538 A  6/2007
JP  2011146991 A  7/2011

OTHER PUBLICATIONS

Wi-Fi Alliance, "Wi-Fi Peer-to-Peer (P2P) Technical Specification, Version 1.1", Wi-Fi Alliance Technical Committee P2P Task Group, 2010.
(Continued)

*Primary Examiner* — Ngon Nguyen
(74) *Attorney, Agent, or Firm* — Banner & Witcoff, Ltd.

(57) ABSTRACT

An image processing system may be configured to perform a connection information transmission process in which connection information used for establishment of communication using a communication protocol is transmitted. Portions of the system may further perform a process by which communication is changed from another communication protocol to the communication protocol in which the connection information is transmitted. Additionally, a job transmission process in which a job is transmitted from an information processing apparatus to an image processing apparatus via the communication protocol may be performed. Based on the job information, an execution process, in which image processing is executed, may be performed.

22 Claims, 12 Drawing Sheets

(51) Int. Cl.
*H04N 1/00* (2006.01)
*H04N 1/60* (2006.01)
*G03F 3/00* (2006.01)
*H04M 1/725* (2006.01)
*H04W 4/00* (2009.01)
*H04L 29/06* (2006.01)

(52) U.S. Cl.
CPC ...... *H04N 1/00238* (2013.01); *H04N 1/00307* (2013.01); *H04W 4/008* (2013.01); *H04L 69/18* (2013.01); *H04L 69/14* (2013.01); *H04N 2201/006* (2013.01); *H04N 2201/0041* (2013.01); *H04N 2201/0055* (2013.01); *H04N 2201/0075* (2013.01); *H04N 2201/0082* (2013.01)
USPC ............ 358/1.15; 358/1.14; 358/1.6; 358/1.9

(56) References Cited

U.S. PATENT DOCUMENTS

| | | |
|---|---|---|
| 2008/0052710 A1 | 2/2008 | Iwai et al. |
| 2008/0084578 A1 | 4/2008 | Walker et al. |
| 2008/0222711 A1 | 9/2008 | Michaelis |
| 2008/0231900 A1 | 9/2008 | Abe |
| 2009/0036056 A1* | 2/2009 | Oshima et al. ............... 455/41.3 |
| 2009/0066998 A1 | 3/2009 | Kato |
| 2009/0073482 A1 | 3/2009 | Tsuchiya |
| 2009/0103124 A1* | 4/2009 | Kimura et al. ............... 358/1.15 |
| 2010/0188695 A1 | 7/2010 | Okigami |
| 2011/0028091 A1 | 2/2011 | Higgins et al. |
| 2011/0090830 A1 | 4/2011 | Churei |
| 2011/0177780 A1 | 7/2011 | Sato et al. |
| 2013/0258390 A1 | 10/2013 | Suzuki et al. |

OTHER PUBLICATIONS

Extended European Search Report issued in European Patent Application No. 13161732.6 dated Jul. 23, 2013.
Anonymous, "Near Field Communication White Paper", Feb. 12, 2004, URL:http://www.ecma-international.org/activities/Communications/2004tg19-001.pdf [retrieved on Mar. 6, 2006].
Non-Final Office Action received in corresponding U.S. Appl. No. 13/834,423 mailed May 9, 2014.
Sep. 4, 2014—(US) Final Office Action—U.S. Appl. No. 13/834,423.
Oct. 27, 2014—(EP) Office Action—App 13 159 607.4.

* cited by examiner

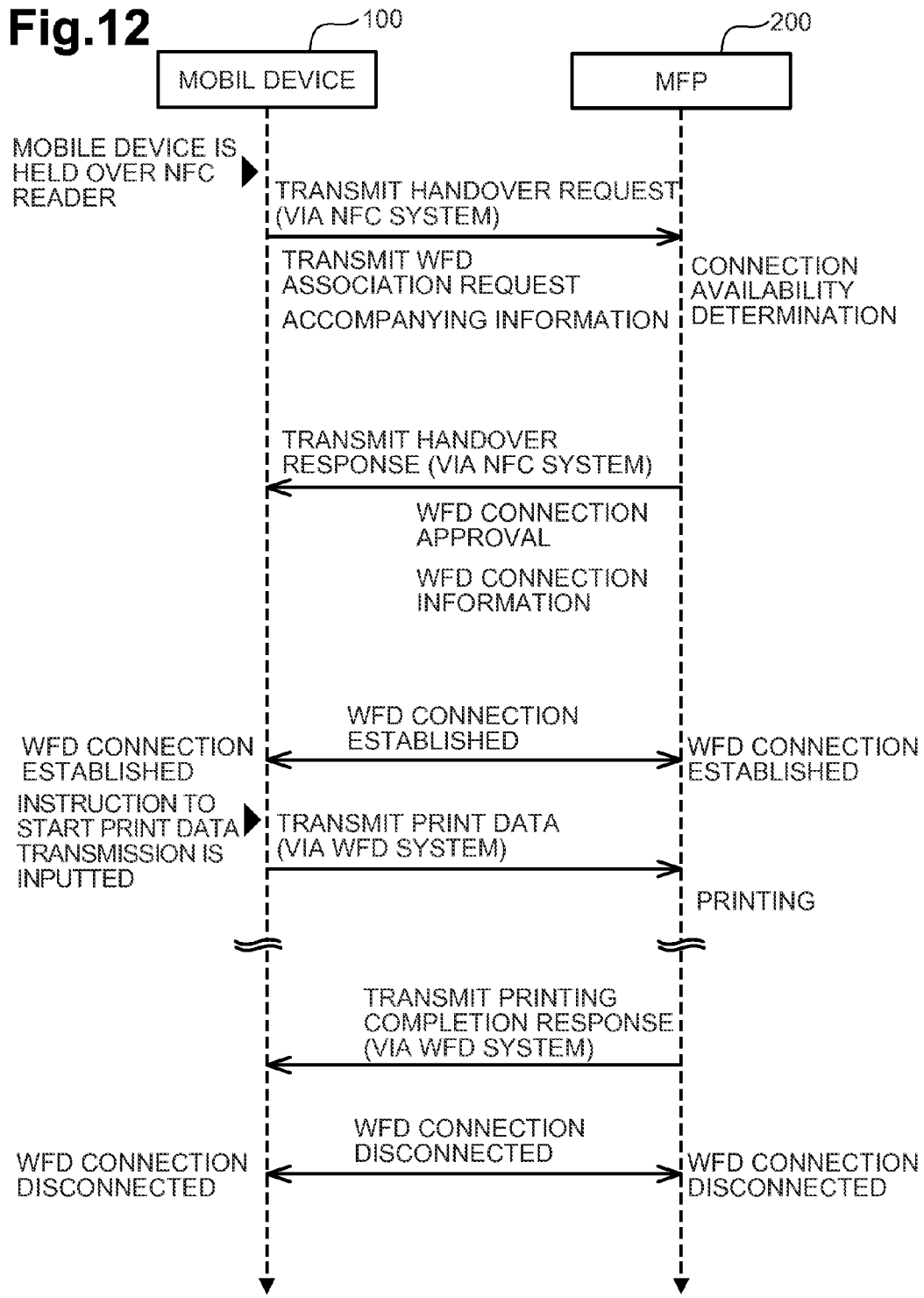

IMAGE PROCESSING APPARATUS, INFORMATION PROCESSING APPARATUS, AND IMAGE PROCESSING METHOD FOR PROCESSING A PRINT JOB TRANSMITTED FROM THE INFORMATION PROCESSING APPARATUS TO THE IMAGE FORMING APPARATUS VIA COMMUNICATION PROTOCOL

CROSS-REFERENCE TO RELATED APPLICATION

This application claims priority from Japanese Patent Application No. 2012-193091, filed on Sep. 3, 2012, which is incorporated herein by reference.

FIELD OF DISCLOSURE

Aspects described herein relate to an image processing apparatus having an image processing function for performing, for example, one or more of printing and scanning, an information processing device that outputs a job for performing image processing, and an image processing system.

BACKGROUND

Recently, a plurality of wireless communication methods, such as a Bluetooth® system (Bluetooth® is a registered trademark owned by BLUETOOTH SIG. INC. of Kirkland, Wash.), a Wireless Fidelity ("Wi-Fi®") system (Wi-Fi® is a registered certification mark owned by the Wi-Fi Alliance of Austin, Tex.), and a Near Field Communication ("NFC") system, have been available to wireless communication between an electronic device, such as a smartphone or a tablet personal computer ("PC"), and an image processing apparatus, such as a scanner or a printer. In a technique of the wireless communication, for example, the NFC system is used first to exchange one of authentication information and setting information between devices, and then, the wireless communication method is changed from the NFC system to another wireless communication method that has a longer communication range and offers higher-speed communication than the NFC system. The above-described changing technique of the wireless communication method has been known as a handover technique.

For example, in a known technique for performing data communication between a communication device and another communication device, the communication device obtains a communication method and an encryption method via short-range wireless communication from the other communication device. When the obtained communication method and encryption method match with the communication method and encryption method specified in the communication device, data communication is performed therebetween using the communication method and the encryption method.

SUMMARY

However, the known technique has the following problem. It is assumed that the handover technique is applied to an image processing system in which data communication is performed between an electronic device and an image processing apparatus. In the image processing system, an user's operation, e.g., a print instruction, may be required to perform image processing. This configuration may impair usability although wireless communication is established therebetween by a handover.

Accordingly, aspects described herein provide for a technique for simplifying an user's operation after establishment of wireless communication in an image processing system comprising an image processing apparatus and an information processing device.

According to the aspects described herein, in the image processing system comprising the image processing apparatus and the information processing device, the technique for simplifying the user's operation after the establishment of wireless communication may be implemented.

Other objects, features, and advantages will be apparent to persons of ordinary skill in the art from the following detailed description of the disclosure and the accompanying drawings.

DESCRIPTION OF THE DRAWINGS

For a more complete understanding of the present disclosure, needs satisfied thereby, and the objects, features, and advantages thereof, reference now is made to the following descriptions taken in connection with the accompanying drawing.

FIG. 12 is a sequence diagram depicting operations performed by each of the mobile device and the MFP in data communication when a job execution instruction is inputted after a handover in a variation of the illustrative embodiment according to one or more aspects of the disclosure.

DETAILED DESCRIPTION

Hereinafter, an image processing system according to an illustrative embodiment is described in detail with reference to the accompanying drawings, like numerals being used for like corresponding parts in the various drawings. In the illustrative embodiment, the aspects of the disclosure may be applied to an image processing system comprising a multi-function peripheral ("MFP") having a printing function and a mobile device configured to accept a print job for allowing the MFP to perform printing.

Figure 1:
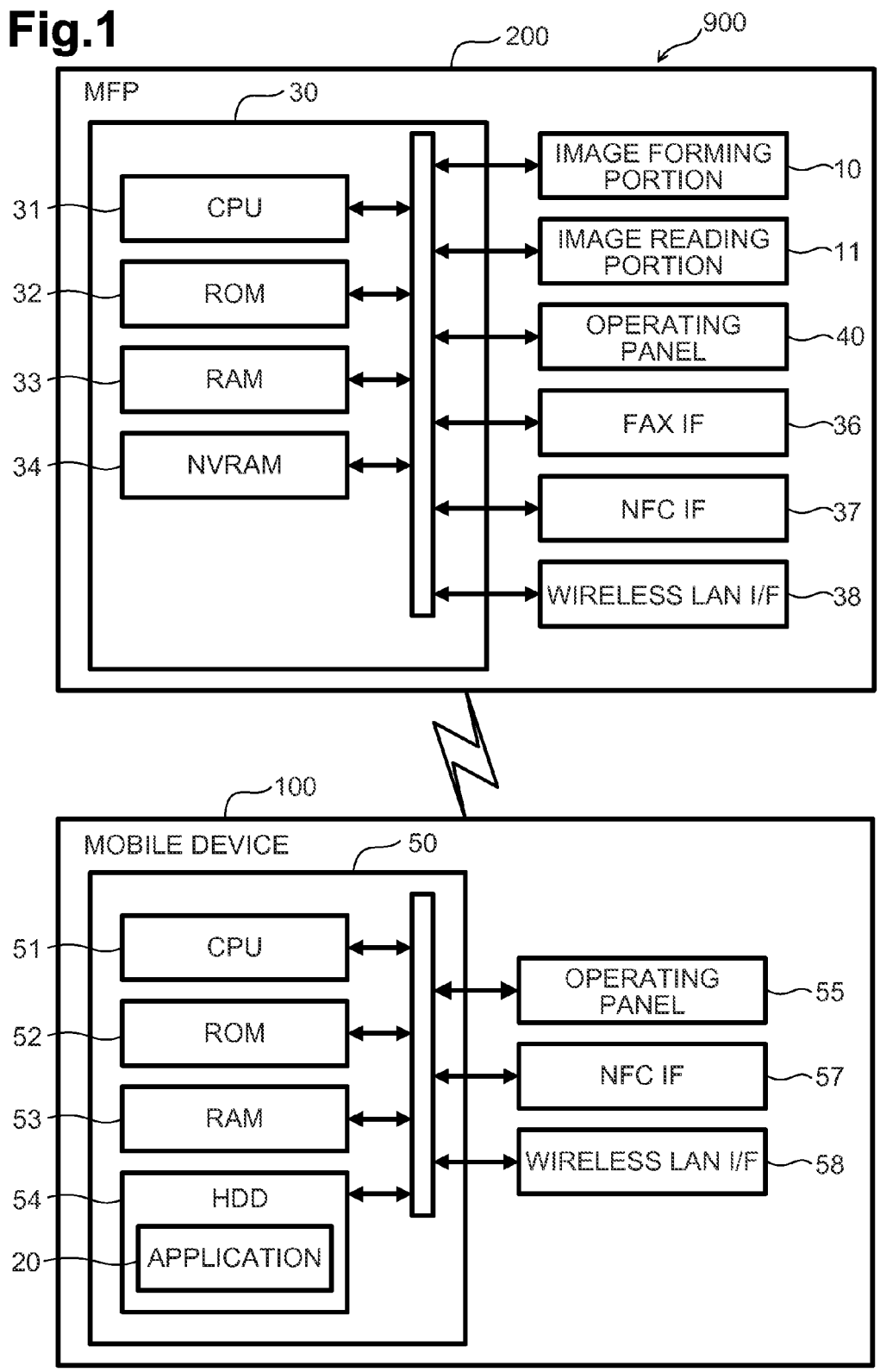
FIG. 1 is a block diagram depicting an example configuration of an image processing system in an illustrative embodiment according to one or more aspects of the disclosure.

As depicted in FIG. 1, an image processing system 900 according to the illustrative embodiment may comprise a mobile device 100 (an example of an information processing device) and an MFP 200 (an example of an image processing apparatus). The mobile device 100 may be configured to output a print job to a specified MFP, e.g., the MFP 200. In the image processing system 900, data transmission or reception may be available between the mobile device 100 and the MFP 200 via wireless communication.

The MFP 200 may be configured to perform one of color printing and monochrome printing. In the illustrative embodiment, the MFP 200 may be allowed to perform the color printing. Further, the MFP 200 may be configured to perform printing by using one of an electrophotographic method and an inkjet method. Moreover, the MFP 200 may be configured to perform one of color scanning and monochrome scanning. In the illustrative embodiment, the MFP 200 may be allowed to perform color scanning. A scanning mechanism equipped in the MFP 200 may adopt one of a charge-coupled device ("CCD") and a Contact Image Sensor ("CIS").

Any number of information processing devices, through which a job for allowing the MFP 200 to perform image processing may be entered, may be included and connected to the MFP 200 in the image processing system 900, as well as the mobile device 100. Further, one or more servers or access points may be connected to the image processing system 900, and communication may be performed between the mobile device 100 and the MFP 200 via the one or more servers or access points.

Next, a general configuration of the MFP 200 is described with reference to FIG. 1. The MFP 200 may comprise a control device 30 that may comprise a central processing unit ("CPU") 31, a read-only memory ("ROM") 32, a random-access memory ("RAM") 33, and a nonvolatile random-access memory ("NVRAM") 34. The MFP 200 may further comprise an image forming portion 10 (an example of an image processing portion), an image reading portion 11 (another example of the image processing portion), an operating panel 40, a facsimile interface ("FAX I/F") 36, an NFC interface ("I/F") 37 (an example of a processing-device-side first communication portion), and a wireless local-area network ("LAN") interface 38 (an example of a processing-device-side first communication portion), with which the control device 30 may be electrically connected. The image forming portion 10 may be configured to print an image onto a sheet. The image reading portion 11 may be configured to read an image from a document. The operating panel 40 may be configured to display operating statuses and to accept a user's input operation.

The ROM 32 may be configured to store various settings and firmware such as various control programs for controlling the MFP 200, as well as certain initial values. The RAM 33 and the NVRAM 34 may be used as workspaces, respectively, for temporarily storing the control programs read from the ROM 32 or as storage areas, respectively, for temporarily storing data.

The CPU 31 may store processing results in the RAM 33 or the NVRAM 34, in response to executing various programs read from the ROM 32 and/or the programs read from the NVRAM 34, and signals sent from sensors.

The facsimile interface 36 may allow the MFP 200 to perform communication with an external device (not depicted) via public networks. The MFP 200 may be configured to transmit or receive data, via the facsimile interface 36, to or from the external device.

The NFC interface 37 may allow the MFP 200 to perform wireless communication using an NFC system in compliance with the International standards, e.g., ISO/IEC 21481 and ISO/IEC 18092. The MFP 200 may be configured to transmit or receive data, via the NFC interface 37, to or from an external device.

The wireless LAN interface 38 may allow the MFP 200 to perform wireless communication using a Wi-Fi Direct system (hereinafter, referred to as a "WFD system") in compliance with the standard IEEE 802.11 and its family standards. A communication method (i.e., the standards for wireless communication) may be different between the NFC system and the WFD system. For example, the communication method of the WFD system may have a longer communication range and a higher communication speed than the communication method of the communication range and speed of the NFC system. The MFP 200 may be configured to transmit or receive data, via the wireless LAN interface 38, to or from an external device.

In the WFD system, a network may be configured between a device that may serve as a group owner and manage the network (hereinafter, referred to as a "group-owner-status device") and a device that may serve as a client (hereinafter, referred to as a "client-status device"). The WFD system may be a communication method that may allow transmission and reception of data between the group-owner-status device and the client-status device in the network. Therefore, in order for the MFP 200 to perform data communication with an external device via the wireless LAN interface 38, the MFP 200 may need to configure a WFD network with the external device by establishing wireless communication with the external device. In the illustrative embodiment, the MFP 200 may serve as the group owner and the mobile device 100 may serve as the client when the WFD network is configured. Not only the mobile device 100 but also the other devices may be allowed to belong in the WFD network, for example, as the client-status device. The MFP 200 may be configured to store identifying information of the client-status device and WFD connection information for establishing wireless communication using the WFD system with the client-status device. The WFD connection information may comprise, for example, a service set identifier ("SSID") that may be an identifier for identifying a WFD network, and a password.

Figure 2:
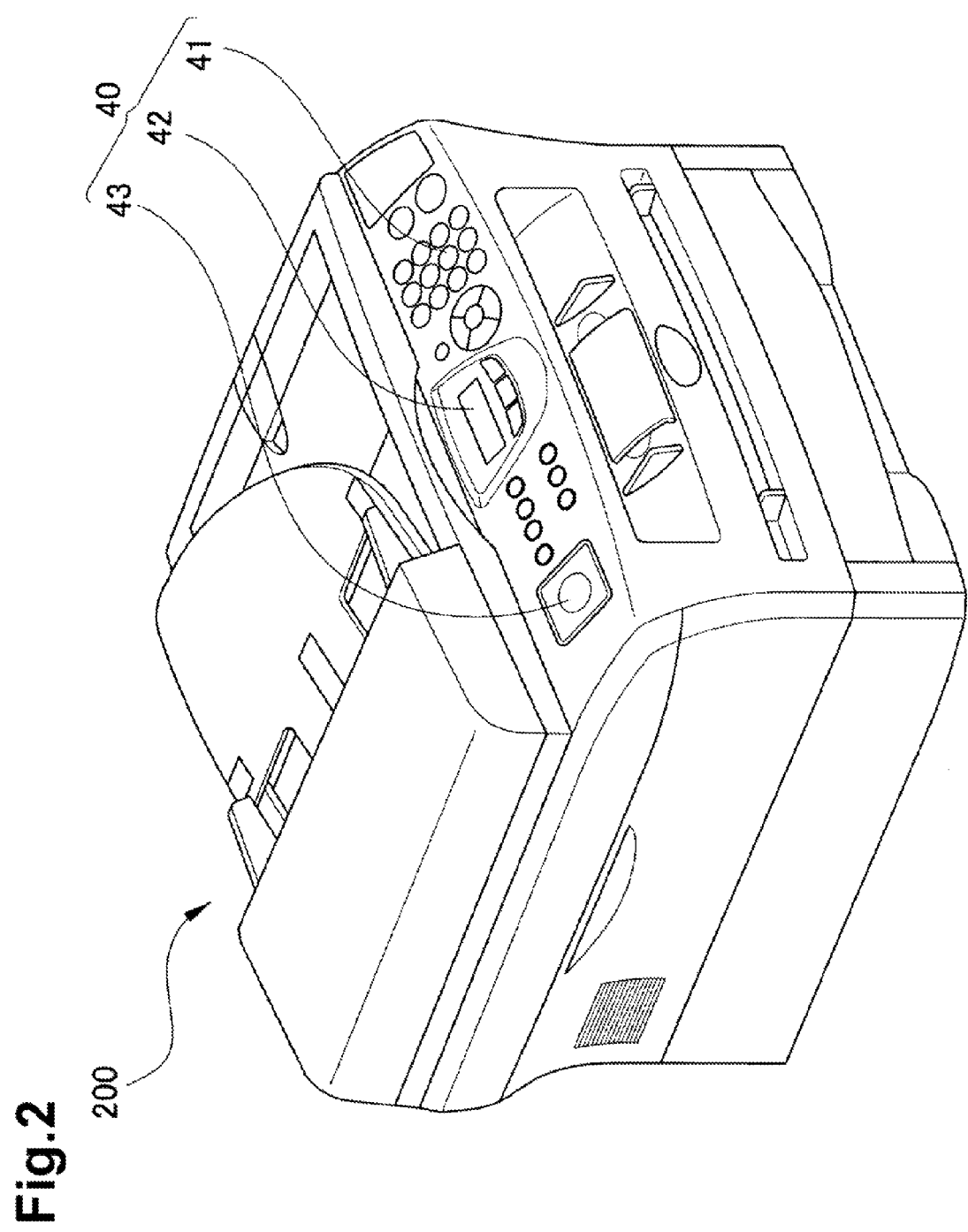
FIG. 2 is a perspective view depicting a multifunction peripheral ("MFP") in the illustrative embodiment according to one or more aspects of the disclosure.

As depicted in FIG. 2, the operating panel 40 may comprise an input portion 41 and a display portion 42. The input portion 41 may comprise various keys and buttons for allowing a user to perform input operations. The display portion 42 may be configured to display various messages and details of settings. The various keys and buttons may comprise, for example, an OK button for instructing a start of image processing and a cancel button for instructing a cancel of image processing.

The operating panel 40 may further comprise an NFC reader 43 for accepting performance of communication using the NFC system. The NFC reader 43 may comprise the NFC interface 37. While the power of the MFP 200 is on, the MFP 200 may be in a state of readiness to detect a device that may be able to perform wireless communication using the NFC system (hereinafter, referred to as an "NFC-enabled device"), by using signals issued from the NFC interface 37. Therefore, for example, when the user holds the mobile device 100 over the NFC reader 43, the MFP 200 may detect the mobile device 100 and thus communication using the NFC system may become available between the mobile device 100 and the MFP 200. To hold the mobile device 100 over the NFC reader 43 may be to locate the mobile device 100 within a communicable range of the NFC interface 37, and it may be unnecessary for the mobile device 100 and the NFC reader 43 to be in contact with each other.

A general configuration of the mobile device 100 is now described with reference to FIG. 1. The mobile device 100 may comprise a control device 50 that may comprise a CPU 51, a ROM 52, a RAM 53, and a hard disk drive ("HDD") 54. The mobile device 100 may further comprise a touch-sensitive operating panel 55, an NFC interface 57 (an example of an instructing-device-side first communication portion), and a wireless LAN interface 58 (an example of an instructing-device-side second communication portion), which may be controlled by the control device 50. The operating panel 55 may have a display function and an input function. The NFC interface 57 may be a communication interface that may allow the mobile device 100 to perform communication with the external device.

The HDD 54 of the mobile device 100 may store an operating system ("OS"), browsers for browsing files on the Internet, and device drivers for controlling various devices. The HDD 54 may also store an application program (hereinafter, referred to as an "application 20") (an example of an accepting portion) for accepting a print job for allowing a printer to print data stored in the mobile device 100.

More specifically, the application 20 may generate print data based on print target data selected by the user. Then, the application 20 may place a print job for allowing a specified printer to print the print data, in a job queue of the mobile device 100. The generation of the print data may be performed by a printer driver installed in the application 20. However, in some examples where the mobile device 100 is configured such that the printer driver is allowed to be installed on the mobile device 100 independently of the application 20, the generation of the print data may be performed by the independent printer driver.

When communication using the WFD system is established between the mobile device 100 and the MFP 200 while the print job is placed in the job queue, the mobile device 100 may transmit the print job placed in the job queue to the MFP 200. Upon receipt of the print job, the MFP 200 may perform printing of the print job. A procedure for establishing the communication using the WFD system between the mobile device 100 and the MFP 200 and a procedure for transmitting a print job are further described later.

The CPU 51 may store processing results in the RAM 53 or the HDD 54, in response to executing various control programs read from the ROM 52 and/or the programs read from the HDD 54. The operations of the application 20 may also be processed by the CPU 51.

Similar to the NFC interface 37 of the MFP 200, the NFC interface 57 may allow the mobile device 100 to perform wireless communication using the NFC system. Similar to the wireless LAN interface 38 of the MFP 200, the wireless LAN interface 58 may allow the mobile device 100 to perform wireless communication using the WFD system. The mobile device 100 may be configured to transmit or receive data to or from the external device via one of the NFC interface 57 and the wireless LAN interface 58.

The application 20 installed on the mobile device 100 is now described with reference to FIGS. 3 and 4. Upon receipt of an instruction to start the application 20 from the user, the mobile device 100 may start the application 20.

Then, the application 20 may display an initial screen, e.g., a data selection screen for allowing the user to select print target data and determine the print target data in accordance with the user's selection. For the data selection, the application 20 may display one or more data names or thumbnail images of data stored in the mobile device 100. Then, the user may touch a data name or a thumbnail image of desired data. Thus, the print target data may be selected.

Figure 3:
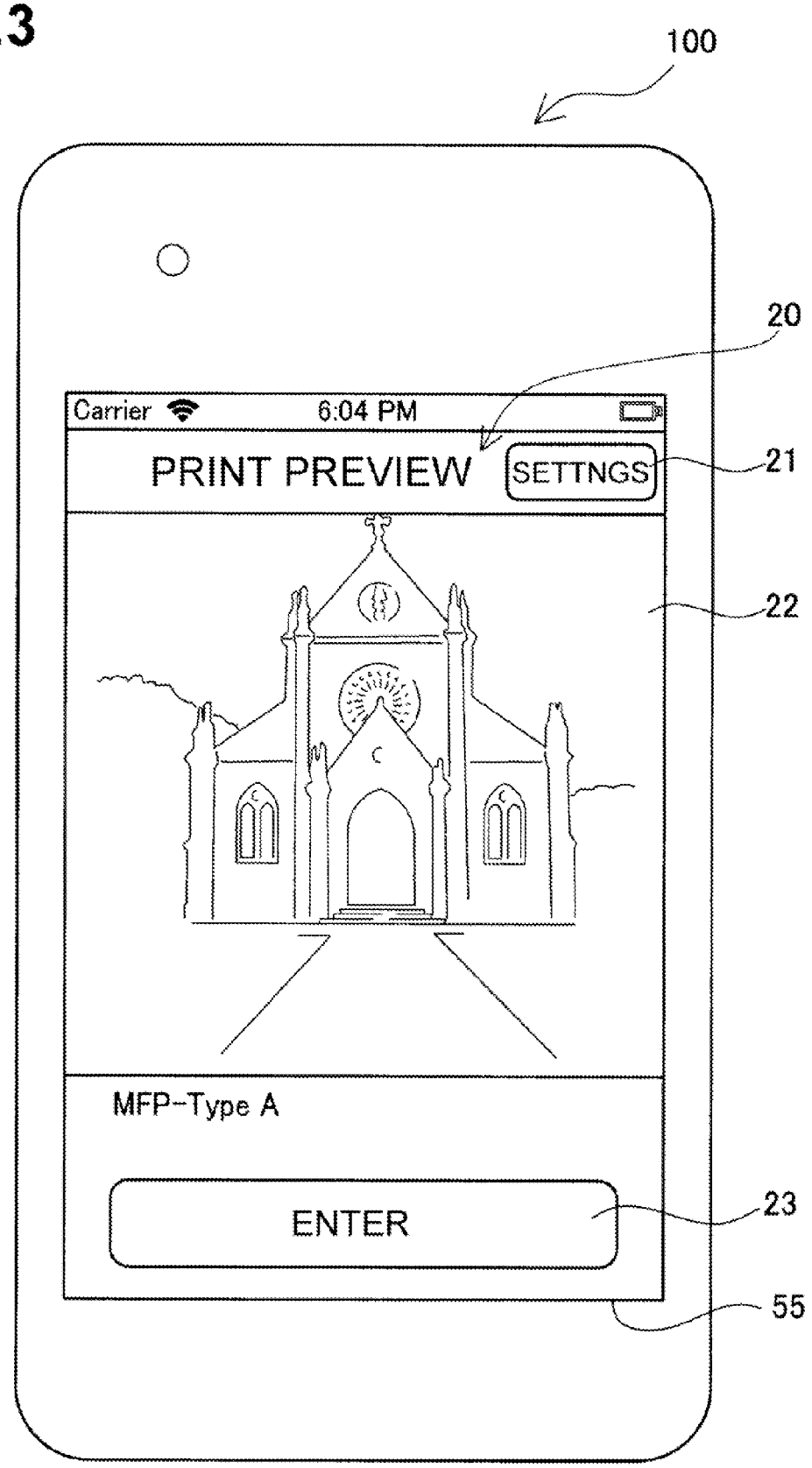
FIG. 3 depicts an example print preview screen of a print application running on a mobile device in the illustrative embodiment according to one or more aspects of the disclosure, wherein the print preview screen is used to accept a print execution instruction.

When the data is selected, the application 20 may display a print preview screen, as depicted in FIG. 3. The print preview screen displayed on the operating panel 55 may comprise a virtual "SETTINGS" button 21, a preview area 22, and a virtual "ENTER" button 23. The virtual "SETTINGS" button 21 may be used to access a print setting screen. The preview area 22 may display a print preview image of the selected print target data. The virtual "ENTER" button 23 may be used to place a print job in a job queue. The user may be allowed to preview a print preview image of the print target data displayed on the preview area 22 so that the user may confirm that the print image is desirable before printing.

Figure 4:
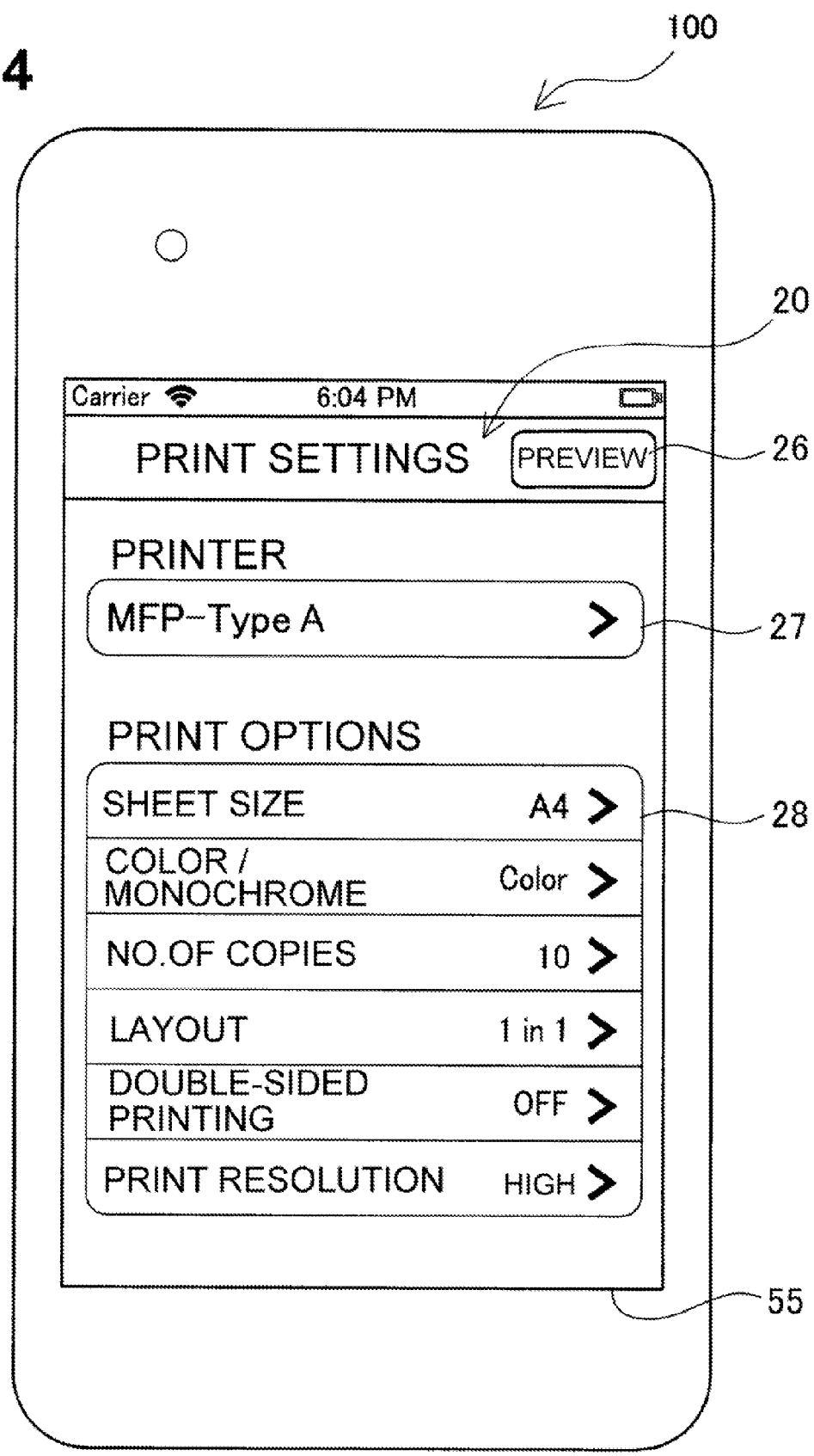
FIG. 4 depicts an example print setting screen of the print application running on the mobile device in the illustrative embodiment according to one or more aspects of the disclosure, wherein the print setting screen is used to accept a change in print settings.

When the virtual "SETTINGS" button 21 is touched or otherwise selected by the user, the application 20 may display a print setting screen, as depicted in FIG. 4. The print setting screen displayed on the operating panel 55 may comprise a virtual "PREVIEW" button 26, a printer specifying area 27, and an option specifying area 28. The virtual "PREVIEW" button 26 may be used to access the print preview screen depicted in FIG. 3. The printer specifying area 27 may be used to specify a printer to be used. The option specifying area 28 may be used to specify one or more print options. When the printer specifying area 27 is touched or otherwise selected by the user, the printer specifying area 27 may list available printers and may allow the user to change a currently-selected printer to another printer to be used for printing. Similarly, when the option specifying area 28 is touched or otherwise selected by the user, the option specifying area 28 may allow the user to change one or more currently-selected printer options to another printer options.

After completing the selection of the print target data and the specification of the print settings, the user may touch/select the virtual "ENTER" button 23 on the print preview screen. Then, the application 20 may generate print data reflecting the printer settings specified on the print setting screen and place a print job for allowing the specified printer, e.g., the MFP 200, to print the print data in the job queue of the mobile device 100 when the virtual "ENTER" button 23 is touched/selected by the user on the print preview screen. Thus, the mobile device 100 may become in a state of readiness to pass the print job to the MFP 200. A procedure for transmitting a print job placed in the job queue to the MFP 200 is further described later.

Figure 5:
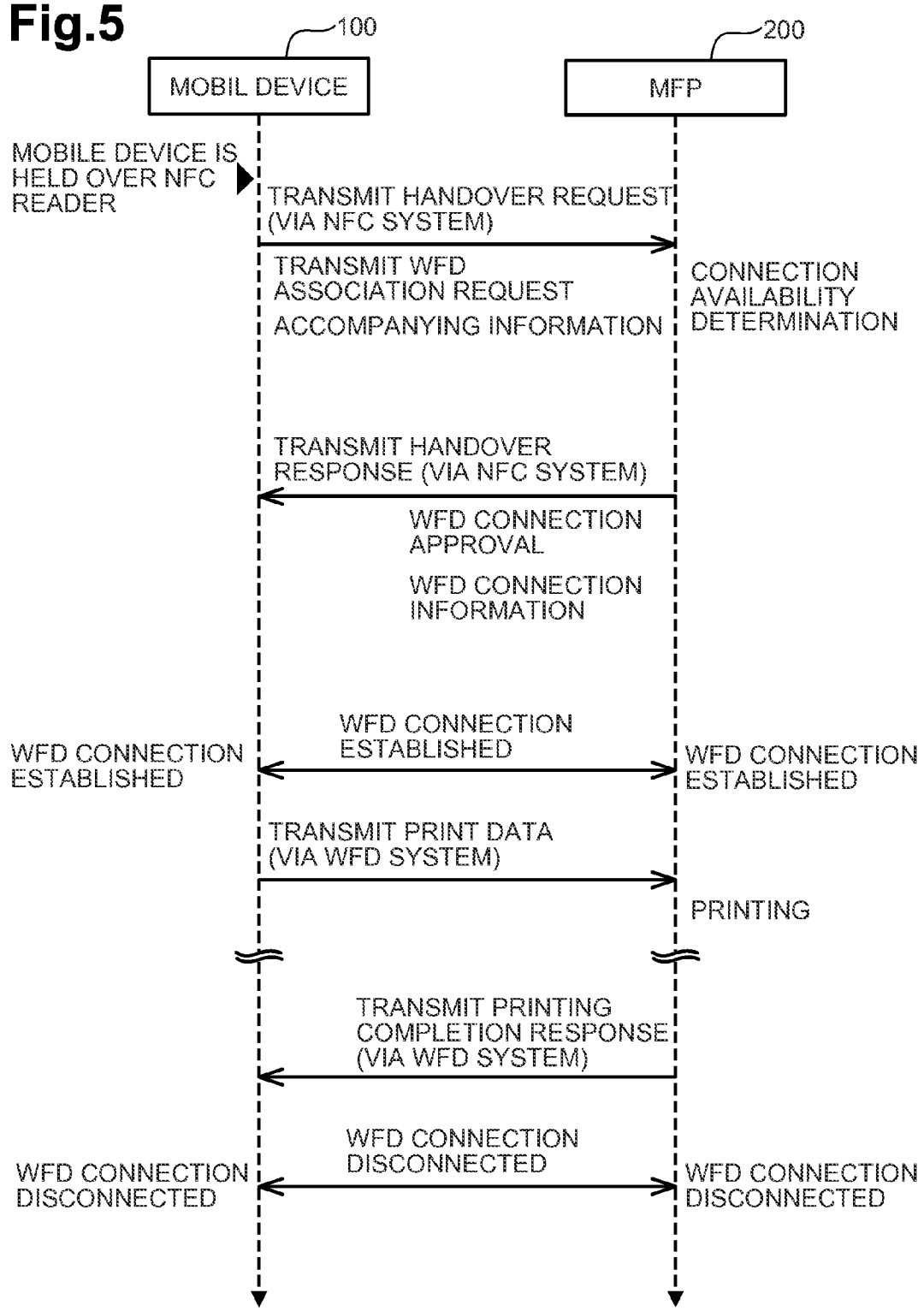
FIG. 5 is a sequence diagram depicting operations performed by each of the mobile device and the MFP in data communication when a handover connection is approved in the illustrative embodiment according to one or more aspects of the disclosure.

An outline of operations from the transmission of a print job from the mobile device 100 to the MFP 200 to the execution of the print job by the MFP 200 in the image processing system 900 is now described with reference to FIG. 5.

To transmit a print job from the mobile device 100 to the MFP 200, the mobile device 100 may accept, in advance, via the application 20, the print job to be transmitted. For example, in the mobile device 100, the print job may be placed in the job queue before the mobile device 100 is held over the NFC reader 43.

First, the user may hold the mobile device 100 over the NFC reader 43 of the MFP 200 while the print job is placed in the job queue of the mobile device 100. By doing so, the MFP 200 may detect the mobile device 100, and thus, wireless communication using the NFC system may become available between the mobile device 100 and the MFP 200.

When the wireless communication using the NFC system becomes available between the mobile device 100 and the MFP 200 while the print job is placed in the job queue of the mobile device 100, the mobile device 100 may transmit a handover request to the MFP 200. The handover request may be transmitted via the wireless communication using the NFC system.

The handover request may further comprise accompanying information of the print job in addition to handover information necessary to change the currently-used communication method to the WFD system. The accompanying information may represent the print settings of the print job and may comprise, for example, a user name, color information, print resolution, data format, data compression method, number of copies, print layout, double-sided printing information, and number of pages included in print data. The accompanying information may further comprise, for example, a group name as necessary. In the illustrative embodiment, the MFP 200 may have the reading function and a facsimile transmitting/receiving function as well as the printing function. Therefore, the accompanying information may further comprise function identifying information.

Upon receipt of the handover request from the mobile device 100, the MFP 200 may determine, based on the accompanying information, whether the MFP 200 is available to establish a connection with the mobile device 100. For example, the MFP 200 may determine whether the MFP 200 has satisfactory performance to handle the print job having the print settings specified by the user. When the MFP 200 does not have satisfactory performance to execute the print job, the MFP 200 may determine that the MFP 200 is not available to establish a connection with the mobile device 100 using, for example, the WFD system. When a print restriction, e.g., a maximum number of pages allowed to be printed in the MFP 200 (hereinafter, also referred to as a maximum page count), is specified, the MFP 200 may determine whether the print job is subject to the print restriction. When the print job is subject to the print restriction, the MFP 200 may determine that the MFP 200 is not available to establish a connection with the mobile device 100 using, for example, the WFD system.

When the MFP 200 may determine that the MFP 200 is available to establish a connection with the mobile device 100, the MFP 200 may transmit a response to the handover request (hereinafter, referred to as a "handover response") to the mobile device 100. The handover response transmitted by the MFP 200 may comprise WFD connection approval that may be information representing that the establishment of the WFD connection between the MFP 200 and the mobile device 100 is approved. The handover response may be transmitted using the NFC system. When the MFP 200 approves the establishment of the WFD connection between the MFP 200 and the mobile device 100, the handover response may further comprise WFD connection information that may be information to be used for changing the currently-used communication method to the WFD system, in addition to the WFD connection approval.

When the mobile device 100 receives the WFD connection approval and the WFD connection information, the mobile device 100 may use the received WFD connection information to establish wireless communication using the WFD system with the MFP 200. For example, a handover of the wireless communication method from the NFC system to the WFD system may be implemented, and thus, the communication method for data communication may be changed. After the wireless communication using the WFD system is established between the mobile device 100 and the MFP 200, the mobile device 100 may transmit, via wireless communication using the WFD system, print data of the print job placed in the job queue of the mobile device 100, to the MFP 200.

Upon receipt of the print data from the mobile device 100, the MFP 200 may start printing of the print data. When the MFP 200 completes printing of all pages of the print data, the MFP 200 may transmit a printing completion response to the mobile device 100. The printing completion response may be transmitted via wireless communication using the WFD system. Upon receipt of the printing completion response from the MFP 200, the mobile device 100 may disconnect the WFD connection established with the MFP 200. Thus, a series of operations may be completed successfully. Using the features described, all the user may have to do to execute printing after the user enters a print job in the mobile device 100 is hold the mobile device 100 over the NFC reader 43 of the MFP 200. By doing so, once started, the series of operations from the transmission of the print data to the printing of the print data may be completed without requiring user operation/input with respect to MFP 200.

Figure 6:
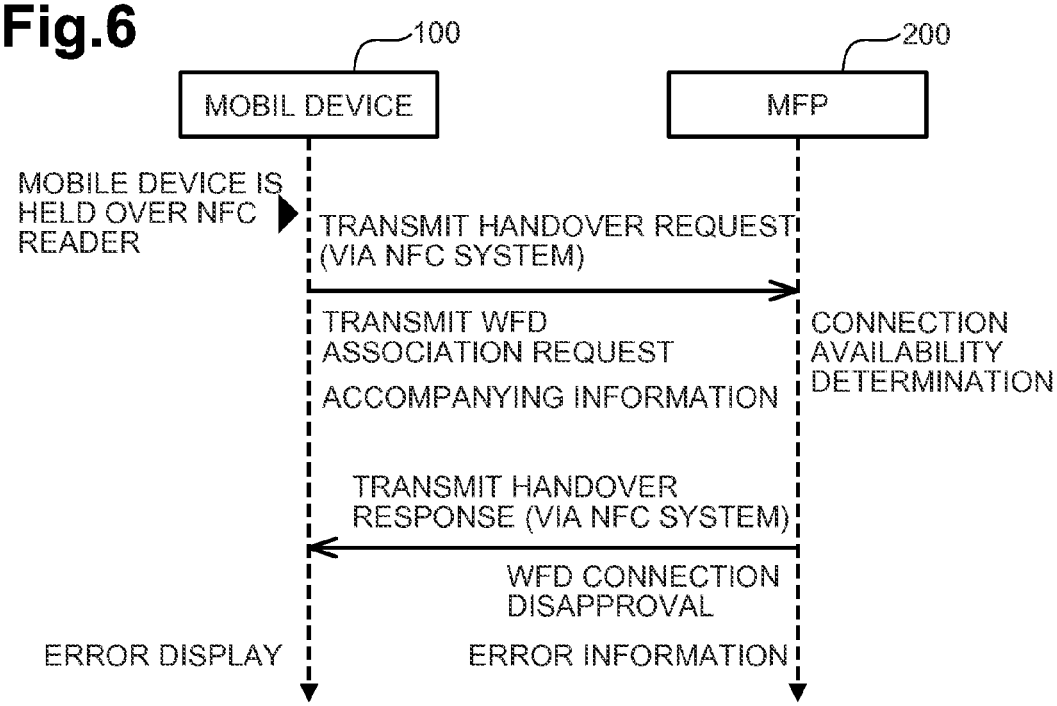
FIG. 6 is a sequence diagram depicting operations performed by each of the mobile device and the MFP in data communication when the handover connection is not approved in the illustrative embodiment according to one or more aspects of the disclosure.

When the MFP 200 determines that the MFP 200 is not available to establish a connection with the mobile device 100, as depicted in FIG. 6, the MFP 200 may transmit a handover response including a WFD connection disapproval to the mobile device 100. The WFD connection disapproval may be information representing that an establishment of a WFD connection is not approved. When an establishment of a WFD connection is not approved, the handover response may further comprise error information representing a reason why the connection using the WFD is not approved. The error information may comprise a cause of the error, for example, that a device dedicated to monochrome printing accepted a print job for color printing or an estimated combined total of the total number of pages to be printed for the print data and the total number of pages actually printed (a current total page count) will exceed a maximum page count if a print job is executed.

Figure 7:
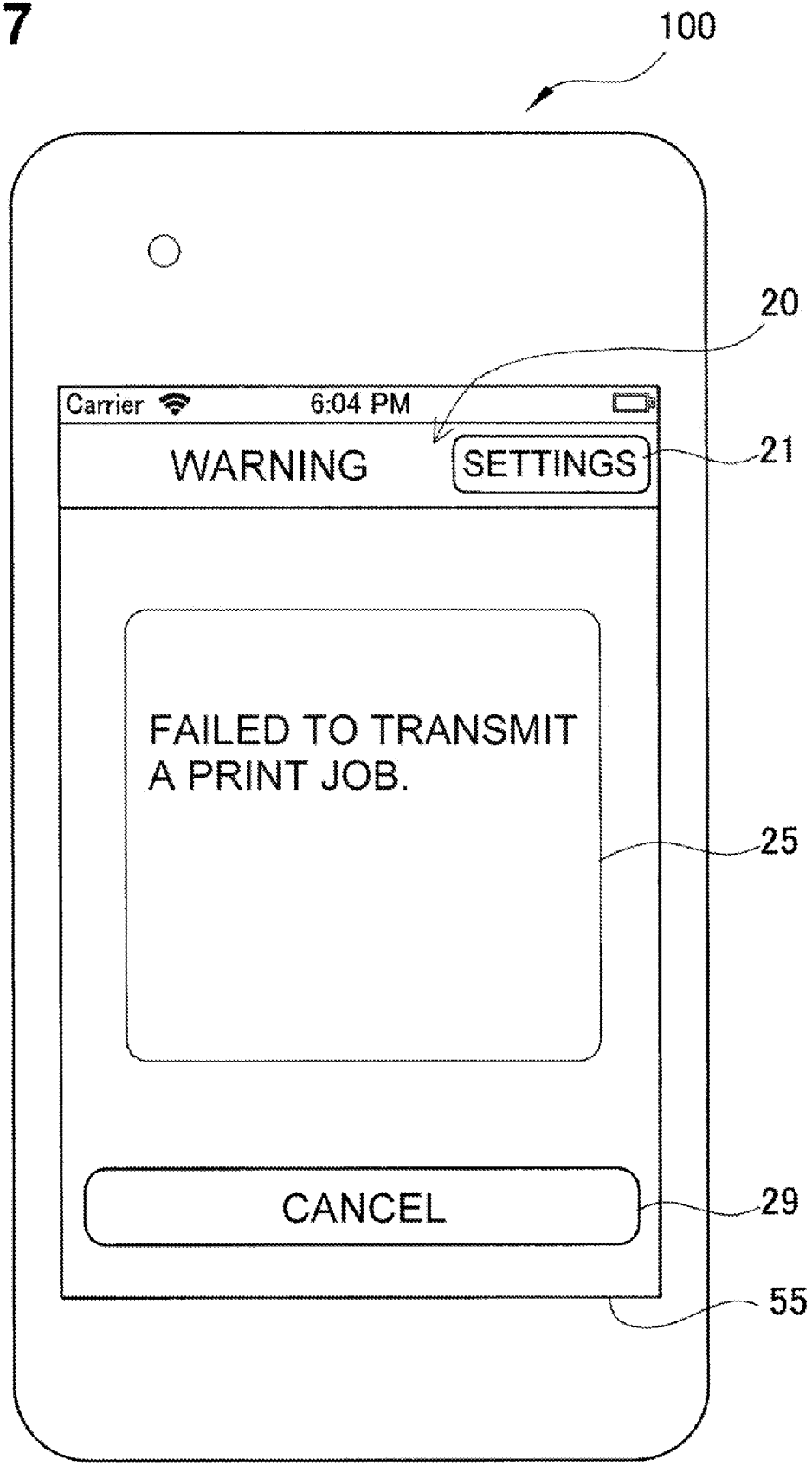
FIG. 7 depicts an example warning screen of the print application running on the mobile device in the illustrative embodiment according to one or more aspects of the disclosure, wherein the warning screen is used to display error information.

When the mobile device 100 has received the WFD connection disapproval, as depicted in FIG. 7, the mobile device 100 may display a message indicating that the mobile device 100 failed to transmit the print job to the specified printer. When the mobile device 100 has further received error information, the mobile device 100 may also display the reason for the occurrence of the error as well as the above message. Thus, the series of operation may be completed without the printing being performed. When the WFD connection is not approved, the mobile device 100 may not attempt to establish a WFD connection and may not transmit the print data to the MFP 200.

In one example, if the mobile device 100 transmits all print jobs placed in the job queue of the mobile device 100 to the MFP 200 after the handover was implemented, the mobile device 100 may transmit, to the MFP 200, unnecessary image data of one or more print jobs for which image processing might not be actually performed. It might not be preferable that the unnecessary image data is transmitted from the mobile device 100 to the MFP 200 because such a data transmission may increase the workload or occupied bandwidth in the network comprising the MFP 200 and resources of the MFP 200.

Therefore, before the handover is performed, it may be determined whether the print job is executable in the specified printer, e.g., the MFP 200. When the print job is unexecutable, the performance of the handover may be disabled. With this configuration, the unnecessary transmission and reception of image data may be avoided. As a result, a load on communication for image data transmission and reception may be reduced. Further, needless use of the resources of the MFP 200 by the image data of the one or more unexecutable print jobs may be avoided. Thus, the use of the MFP 200 by other users may not be restricted.

In some arrangements, the mobile device 100 may be configured to automatically erase the print job that caused the error from the job queue or make an inquiry, to the user, about whether the print job that caused the error is erased from the job queue. In other cases, the mobile device 100 may be configured to notify the user that the print settings need to be changed to complete the printing with or without erasing the print job.

Figure 8:
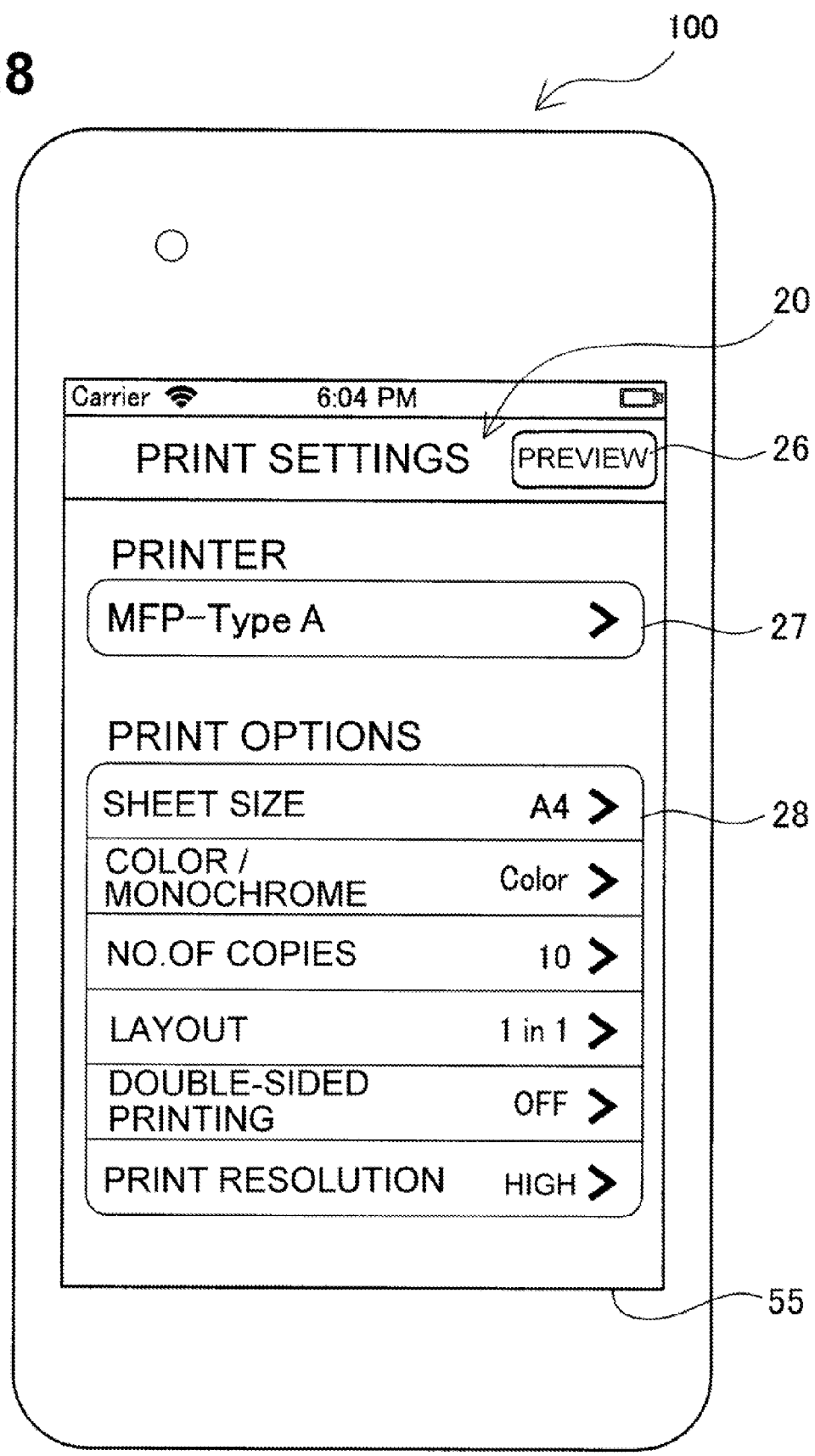
FIG. 8 depicts an example print setting screen of the print application running on the mobile device when an error occurs in the illustrative embodiment according to one or more aspects of the disclosure.

One example way to display the details of the error with the message may be to output a message informing of the details of the error to a message display area 25 on the warning screen of the application 20, as depicted in FIG. 7. Another example way to display the details of the error with the message may be to highlight one or more print options that caused the error. In the application 20 according to the illustrative embodiment, the virtual "SETTINGS" button 21 for accessing the print setting screen may be displayed on the warning screen to accept the screen shift to the print setting screen for the print job whose transmission failed. Then, on the print setting screen, as depicted in FIG. 8, "N/A (not available)" may be added to the one or more print setting items that caused the error. For example, when an error occurred because the estimated combined total of the total number of pages to be printed for the print data and the total number of pages actually printed will exceed the maximum page count if a print job is executed, "N/A" may be added to the print setting item "NO. OF COPIES" in the option specifying area 28 of the print setting screen. In other embodiments, when the one or more print setting items that caused the error is highlighted, for example, the one or more applicable print setting items may blink or be indicated in a different color from the other print setting items.

After the screen is changed to the print setting screen from the warning screen, when the user touches the virtual "PREVIEW" button 26 on the print setting screen to move to the print preview screen depicted in FIG. 3, the user may be allowed to enter the print job in the job queue again by touching the virtual "ENTER" button 23 on the print preview screen. In this case, then, the user may again hold the mobile device 100 over the NFC reader 43 of the MFP 200 to transmit the print data via wireless communication using the WFD system to the MFP 200, and thus, the MFP 200 may perform printing of the received print job. The user may be allowed to cancel the execution of the print job by touching a virtual "CANCEL" button 29 on the warning screen.

Figure 9:
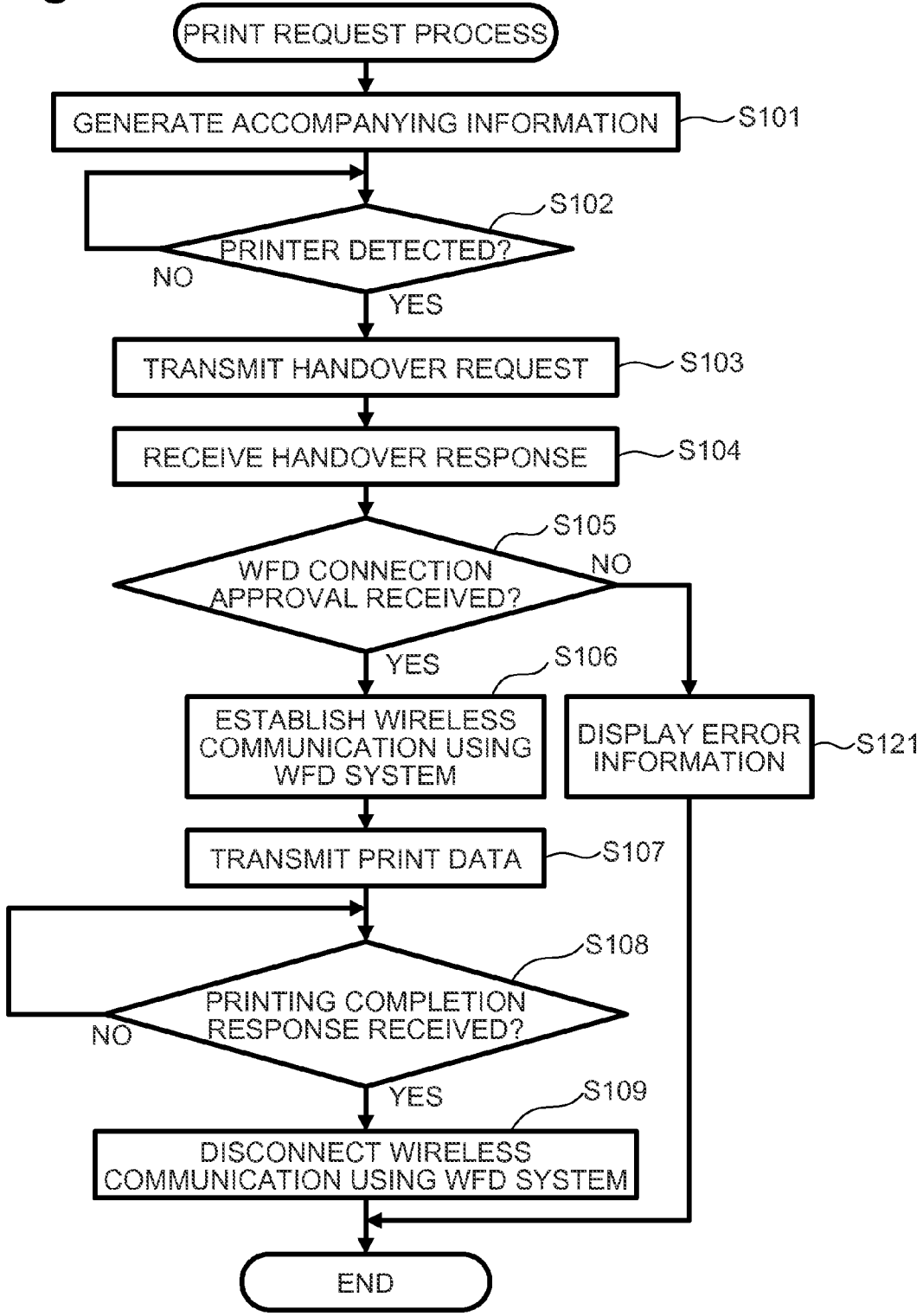
FIG. 9 is a flowchart depicting an example print request process performed in the mobile device in the illustrative embodiment according to one or more aspects of the disclosure.

Hereinafter, processes performed by each device that may implement the operations of the above-described image processing system are described. First, a print request process performed by the mobile device 100 is described with reference to a flowchart in FIG. 9. The print request process may be performed by the CPU 51 when the CPU 51 detects the entry of a print job in the job queue performed by the touching of the virtual "ENTER" button 23 of the application 20 by the user.

In the print request process, first, the CPU 51 may generate accompanying information for the print job entered in the job queue (step S101). The accompanying information may represent the details of the print settings for the print job, as described above. After step S101, the CPU 51 may determine whether a printer that may be a destination of the print job has been detected (step S102). In the illustrative embodiment, the CPU 51 may receive connection confirmation from the MFP 200 while the user holds the mobile device 100 over the NFC reader 43 of the MFP 200. When the mobile device 100 receives the connection confirmation, the CPU 51 may determine that the destination printer has been detected. While the destination printer is not detected (NO in step S102), the routine may wait until the CPU 51 determines that the destination printer has been detected.

When the CPU 51 determines that the destination printer has been detected (YES in step S102), the CPU 51 may transmit a handover request to the detected destination printer via the NFC interface 57 (step S103). The handover request may comprise the handover information necessary to change the currently-used communication method to the WFD system and the accompanying information generated in step S101. Hereinafter, it may be assumed that the detected destination printer is the MFP 200.

After step S103, the CPU 51 may receive a handover response from the destination MFP 200 (step S104). The handover response may comprise connection availability information representing whether a handover to the WFD system is available to establish a connection with the MFP 200. Then, the CPU 51 may determine whether WFD connection approval has been received (step S105).

When the CPU 51 determines that WFD connection approval has been received (YES in step S105), the CPU 51 may transmit connection confirmation to the MFP 200 in response to the handover request and establish wireless communication using the WFD system with the MFP 200 by using the WFD connection information included in the handover response as well as the WFD connection approval (step S106). That is, the handover from the NFC system to the WFD system may be implemented. After establishing the wireless communication using the WFD system with the MFP 200, the CPU 51 may transmit print data of the print job placed in the job queue to the MFP 200 (step S107).

After step S107, the CPU 51 may determine whether a printing completion response has been received (step S108). While a printing completion response is not received (NO in step S108), the routine may wait until the CPU 51 determines that a printing completion response has been received. When the CPU 51 determines that a printing completion response has been received (YES in step S108), the CPU 51 may transmit disconnection confirmation to the MFP 200 and disconnect the wireless communication using the WFD system (step S109). After step S109, the CPU 51 may end the print request process.

When the CPU 51 determines that WFD connection disapproval has been received (NO in step S105), the CPU 51 may display, on the operating panel 55, a message indicating that the WFD connection failed, by using the error information included in the handover response as well as the WFD connection disapproval (step S121). When the handover response comprises error information representing the details of the occurred error, the CPU 51 may also display the details of the occurred error on the operating panel 55. After step S121, the CPU 51 may end the print request process.

Figure 10:
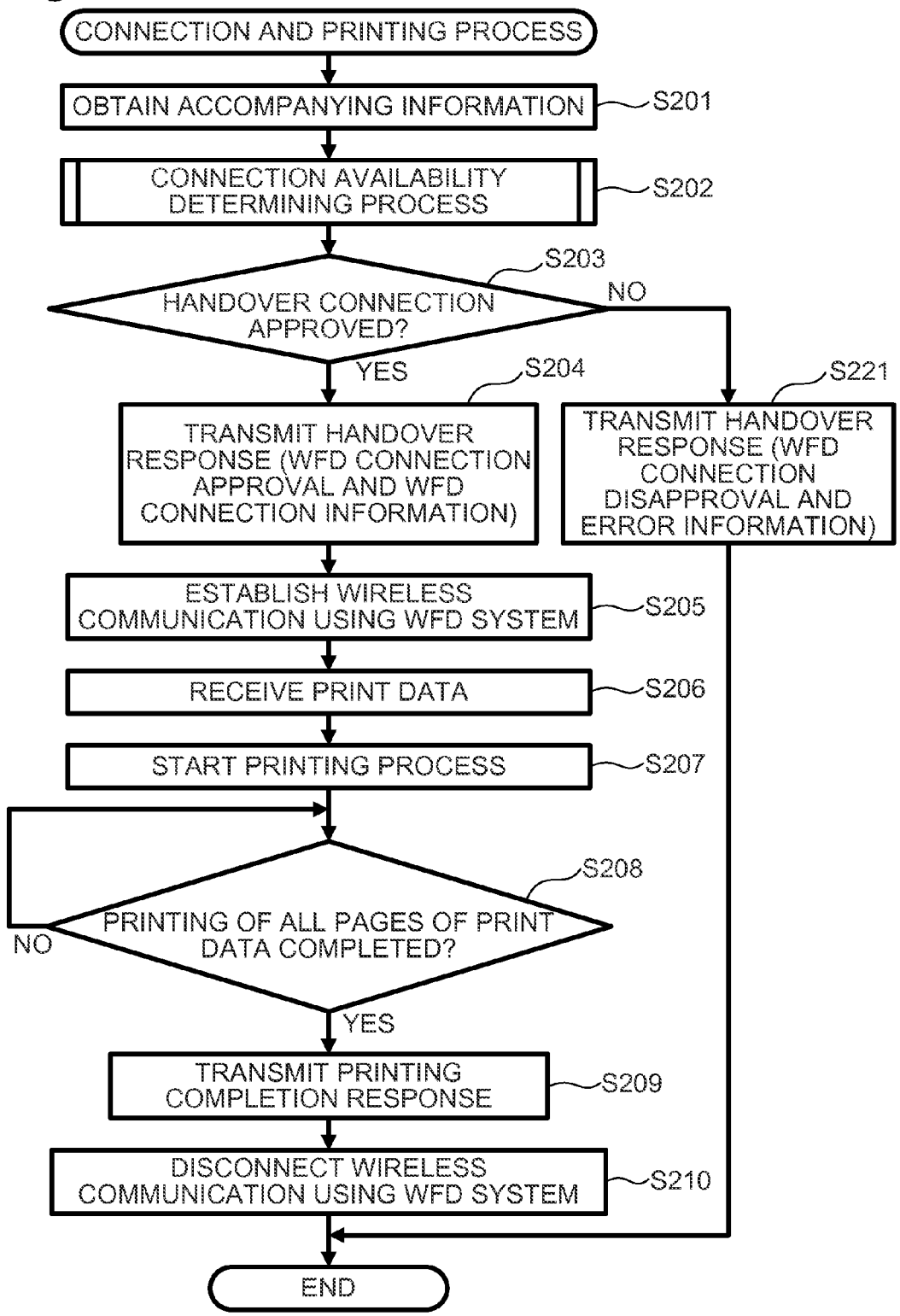
FIG. 10 is a flowchart depicting an example connection and printing process performed in the MFP in the illustrative embodiment according to one or more aspects of the disclosure.

Next, a connection and printing process performed by the MFP 200 is now described with reference to a flowchart in FIG. 10. The connection and printing process may be performed by the CPU 31 when the CPU 31 detects an NFC-enabled device with which the NFC interface 37 of the MFP 200 is able to perform wireless communication using the NFC system. Hereinafter, it may be assumed that the NFC-enabled device detected by the CPU 31 is the mobile device 100.

In the connection and printing process, first, the CPU 31 may receive a handover request from the mobile device 100 and obtain accompanying information included in the handover request (step S201). Then, the CPU 31 may perform a connection availability determining process for determining, based on the accompanying information, whether a handover connection is approved (step S202).

Figure 11:
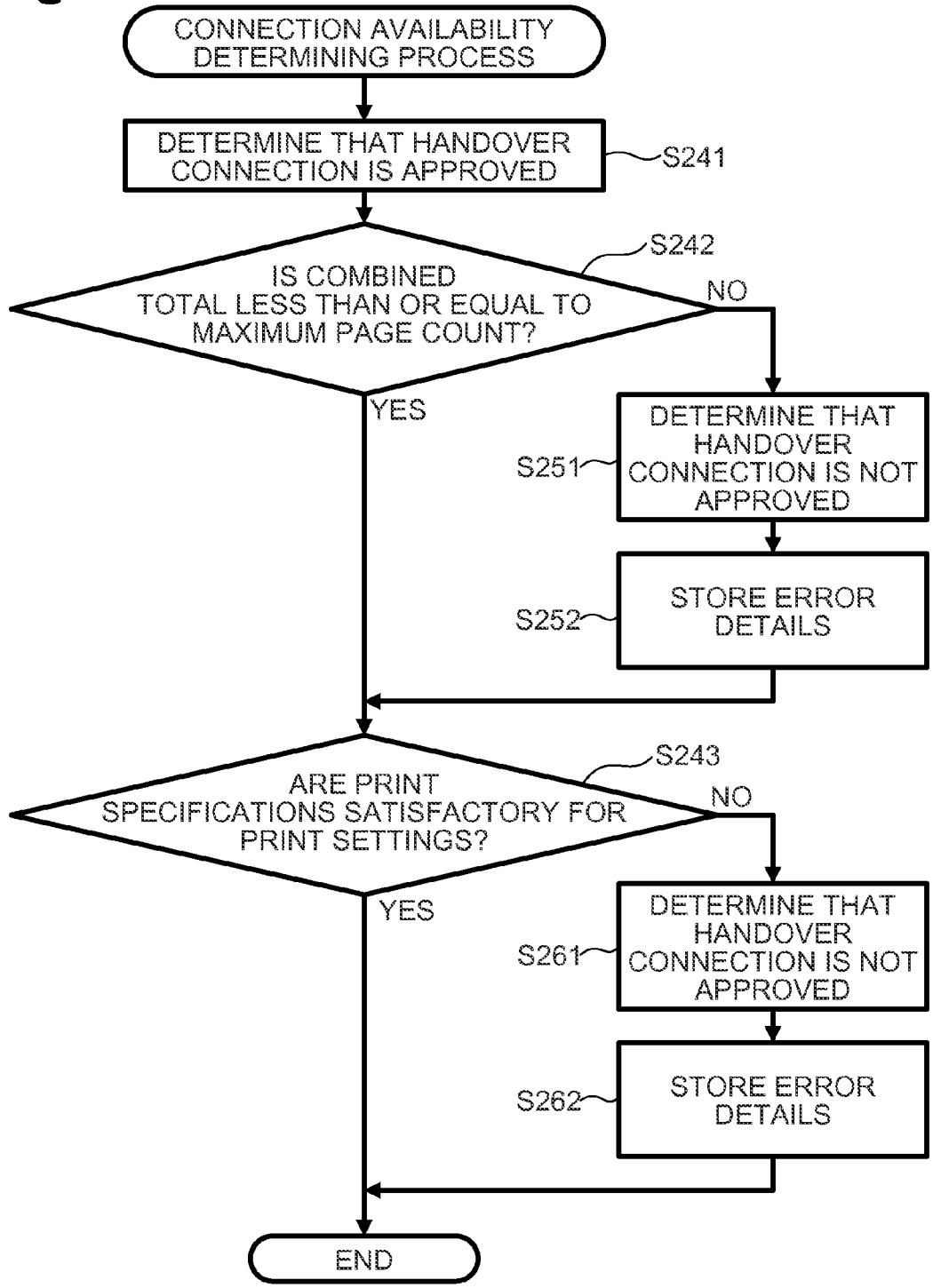
FIG. 11 is a flowchart depicting an example connection availability determining process performed in the MFP in the illustrative embodiment according to one or more aspects of the disclosure.

Here, the connection availability determining process in step S202 is now described with reference to a flowchart in FIG. 11. In the connection availability determining process, the CPU 31 may determine, as an initial value of a determination result, that the handover connection is approved (step S241).

Then, the CPU 31 may determine, based on the total number of pages to be printed for the print data obtained from the accompanying information, whether an estimated combined total of the total number of pages to be printed for the print data and the total number of pages actually printed (a current total page count) is less than or equal to the maximum page count (step S242). More specifically, the total number of pages to be printed of the print data may be obtained by multiplying the number of pages included in the print data by the number of copies. The maximum page count may be a value specified by printer, user, or group. The current total page count (or the number of pages available to be printed until the current total page count reaches the maximum page count) and the maximum page count may be stored in the MFP 200 or the other device, such as the server.

When the estimated combined total exceeds the maximum page count (NO in step S242), the CPU 31 may determine that the handover connection is not approved (step S251). For example, the CPU 31 may change the determination result from approval to disapproval for the handover connection. Further, the CPU 31 may store details of the error indicating that the page count will exceed the maximum page count if the print data is printed, on a database where error details may be stored (step S252).

After step S252 or when the combined total is less than or equal to the maximum page count (YES in step S242), the CPU 31 may determine, based on the print settings obtained from the accompanying information, whether print specifications of the MFP 200 are satisfactory for the print settings (step S243). For example, the CPU 31 may determine whether the MFP 200 is able to perform the print options specified in the print-color setting, the print-resolution setting, and the double-sided printing setting, with its print specifications.

When the CPU 31 determines that the print specifications of the MFP 200 are not satisfactory for the print settings (NO in step S243), the CPU 31 may determine that the handover connection is not approved (step S261). For example, the determination result may be changed from approval to disapproval for the handover connection. When the determination result has already been changed in step S251, the routine may skip step S261. Then, the CPU 31 may store details of the occurred error, as to one or more options that may not be available in the print specifications, in the database where error details may be stored (step S262).

After step S262 or when the CPU 31 determines that the print specifications are satisfactory for the print settings (YES in step S243), the CPU 31 may end the connection availability determining process. For example, when a positive determination (YES) is made in both steps S242 and S243, the CPU 31 may adopt the determination made in step S241 that the handover connection is approved, and when a negative determination (NO) is made in one of steps S242 and S243, the CPU 31 may determine that the handover connection is not approved.

Referring again to FIG. 10, after step S202, the CPU 31 may determine whether the result of the connection availability determining process in step S202 is approval for the handover connection (step S203). When the CPU 31 determines that the result of the connection availability determining process is approval for the handover connection (YES in step S203), the CPU 31 may transmit a handover response comprising WFD connection approval and WFD connection information to be used communication using the WFD system to the MFP 200 (step S204). After step S204, the CPU 31 may establish wireless communication using the WFD system between the MFP 200 and the mobile device 100 after receiving connection confirmation from the mobile device 100 (step S205). That is, the CPU 31 may implement the handover from the NFC system to the WFD system.

After the wireless communication using the WFD system is established therebetween, the CPU 31 may receive the print data from the mobile device 100 via wireless communication using the WFD system (step S206). Upon receipt of the print data, the CPU 31 may allow the image forming portion 10 to start printing (step S207). After allowing the image forming portion 10 to perform the printing, the CPU 31 may determine whether the printing of all pages of the received print job has been completed (step S208). When the printing of all pages of the received print job has not been completed (NO in step S208), the routine may wait until the printing of all pages of the received print job is completed.

When the printing of all pages of the received print job has been completed (YES in step S208), the CPU 31 may transmit a printing completion response to the mobile device 100 (step S209). After step S209, the CPU 31 may disconnect the wireless communication using the WFD system established between the MFP 200 and the mobile device 100 after receiving disconnection confirmation from the mobile device 100 (step S210). After step S210, the CPU 31 may end the connection and printing process.

When the CPU 31 determines that the result of the connection availability determining process is disapproval for the handover connection (NO in step S203), the CPU 31 may transmit a handover response comprising WFD connection disapproval and error information as to one or more errors that may be factors of the connection disapproval to the MFP 200 (step S221). The error information may be the information stored in the database in step S252 or S262 of the connection availability determining process in step S202. After step S221, the CPU 31 may end the connection and printing process without implementing the handover.

As described above, in the image processing system 900, when the wireless communication using the NFC system (an example of short-range communication) is established while a condition for executing a job is satisfied (e.g., in the illustrative embodiment, a print job is placed in the job queue of the mobile device 100, the print settings of the print job are available in the MFP 200, and no print restriction is imposed on the print job), the operations from the handover of the wireless communication from the NFC system to the WFD system (an example of long-range communication) to the execution of the print job may be performed as a series of operations. With this configuration, after the wireless communication WFD system is established, it may be unnecessary for the user to perform another operation, e.g., an input operation for instructing the execution of the print job, for completion of printing by MFP 200. Therefore, this configuration may save the user from having to perform additional operation after the handover. Accordingly, for example, it may be unnecessary for the user to determine the print settings of the print job while the wireless communication is established between the mobile device 100 and the MFP 200. Thus, the user may be allowed to enter a print job in the mobile device 100 at a location distanced from the MFP 200, e.g., the outside of home or office, and moreover, this configuration may result in an increase of usability of the image processing system 900.

While the disclosure has been described in detail with reference to the specific embodiment thereof, this is merely an example, and various changes, arrangements and modifications may be applied therein without departing from the spirit and scope of the disclosure. For example, the information processing device in which a print job is placed therein may be any devices that may be allowed to perform wireless communication and have a function of controlling the image processing apparatus. The mobile device 100 may be, for example, a smartphone or a tablet PC. Further, the image processing apparatus may be any device that may have the image processing function, for example, a copying machine, a printer, a scanner, or a facsimile machine, as well as a multifunction peripheral, e.g., the MFP 200.

In the illustrative embodiment, the NFC system may be adopted as the short-range communication, the WFD system may be adopted as the long-range communication, and the handover from the NFC system to the WFD system may be implemented. Nevertheless, the communication method for implementing the handover is not limited to the disclosure. Different communication methods that have different communication ranges or protocols may be adopted. For example, in other embodiments, Bluetooth® system, TransferJet system, or Wi-Fi® system that is a system for non-direct communication using an access point, may be adopted as the communication method.

In the illustrative embodiment, the CPU 31 may discriminate between the print restriction comprising, e.g., a user name and the total number of pages to be printed, as factors for determination, and the print specifications comprising, e.g., print resolution and double-sided printing, as factors for determination, and determine, based on the factors for determination, whether a handover connection is approved. Nevertheless, the factors for determination may be changed (e.g., added or removed) as appropriate. Further, the factors for determination are not limited to the specific embodiment. For example, in other embodiments, when one of a paper jam and a breakdown occurs in the MFP 200 or when the MFP 200 is short of consumables, e.g., ink, toner, or sheets, the CPU 31 may determine that the handover connection is not approved.

In the illustrative embodiment, because the job to be executed is a print job, print data that may be an image processing target may be transmitted from the mobile device 100 to the MFP 200 via wireless communication using the WFD system. Nevertheless, in other embodiments, the job to be executed may be a job related to one of the other functions. For example, the job to be executed in the MFP 200 may be a scanning job. In this case, the same processing as the processing for the print job may be performed until wireless communication using the WFD system is established. After the wireless communication using the WFD system is established, the MFP 200 may start document scanning and transmit image data to the mobile device 100 via wireless communication using the WFD system. When a scanning job is executed in the MFP 200, the user may set one or more desired documents on the MFP 200 in advance and then hold the mobile device 100 over the NFC reader 43 of the MFP 200 while an application for receiving image data is started and scan settings (e.g., scan resolution and scan color) have been specified in the mobile device 100.

In the illustrative embodiment, the handover response to be transmitted may comprise error information when the handover connection is not approved. Nevertheless, in other embodiments, for example, the handover response may not comprise the error information. In this case, the details of the error information may not be displayed on the mobile device 10.

In the illustrative embodiment, the handover request to be transmitted may comprise the accompanying information of the job, and the CPU 31 may be determine, based on the accompanying information, whether the handover connection is approved. Nevertheless, it may be unnecessary for the CPU 31 to determine the connection availability. In other embodiments, for example, when the user holds the mobile device 100 over the NFC reader 43 after completing the specification of the print settings, the MFP 200 may perform a handover first without performing the connection availability determination, and then perform the operations from after the completion of the handover to the transmission of all of one or more jobs. The all of one or more jobs transmitted may comprise one or more print jobs that the MFP 200 cannot execute. In this case, the handover request may not necessarily comprise accompanying information. After the wireless communication using the WFD system is established, it may be preferable to transmit the accompanying information via wireless communication using the WFD system before the transmission of print data starts.

In the illustrative embodiment, a handover request may comprise accompanying information of a job and it may be determined, based on the accompanying information, whether a handover is approved. When the handover is approved, the routine may complete the execution of the job. Nevertheless, in other embodiments, as depicted in FIG. 12, it may be configured such that the routine may wait for an user's input to start transmission of print data after the routine completes the handover. In other cases, it may be configured such that the routine may wait for an user's input to start transmission of print data after a WFD connection approval is received and before a handover is implemented. As described above, it may be configured such that the printing process is performed with user's permission although this configuration may require additional user operation after the user holds the mobile device 100 over the NFC reader 43 as compared with the illustrative embodiment.

In the illustrative embodiment, when the virtual "ENTER" button 23 of the application 20 is touched/selected, e.g., when a print job is entered, print data (e.g., a page description language ("PDL") file) that may describe an appearance of a printed page may be generated. Nevertheless, the timing of the print data generation is not limited to the specific embodiment. For example, in other embodiments, for example, print data may be generated when data is transferred after the establishment of wireless communication using the WFD system.

The processes disclosed in the above-described illustrative embodiment may be performed by a single CPU, a plurality of CPUs, hardware, for example, a special application specific integrated circuit ("ASIC"), or a combination of a CPU and an ASIC. Further, the processes disclosed in the above-described illustrative embodiment may be implemented by various manners, for example, by executing one or more programs stored on computer-readable storage media or by methods.

What is claimed is:

1. An image processing apparatus comprising:
   a first communication device configured to process communications according to a first communication protocol;
   a second communication device configured to process communications according to a second communication protocol;
   a processor; and
   memory storing computer readable instructions that, when executed, cause the image processing apparatus to:
   receive information from an information processing apparatus through the first communication device using the first communication protocol, the information relating to an image processing function and including a setting value for the image processing function;
   determine whether the setting value is compatible with the image processing apparatus; and
   in response to determining that the setting value is compatible with the image processing apparatus:
      transmit, to the information processing apparatus, connection information required to establish communication with the image processing apparatus through the second communication device using the second communication protocol;
      establish a connection with the information processing apparatus through the second communication device using the second communication protocol;
      receive image processing data from the information processing apparatus through the second communication device using the second communication protocol; and
      execute the image processing function based on the image processing data; and
   in response to determining that the setting value is incompatible with the image processing apparatus, determining that the image processing apparatus is unavailable to establish the connection with the information processing apparatus.

2. The image processing apparatus of claim 1, wherein the computer readable instructions, when executed, further cause the image processing apparatus to transmit a notification via the first communication device in response to determining that the setting value is incompatible with the image processing apparatus, wherein the notification is configured to be displayed on the information processing apparatus, and
   wherein the notification indicates that the setting value is incompatible with the image processing apparatus.

3. The image processing apparatus of claim 2,
   wherein the notification identifies the setting value that is incompatible with the image processing apparatus.

4. The image processing apparatus of claim 1,
   wherein the setting value corresponds to a usage limit number of the image processing function.

5. The image processing apparatus of claim 1, wherein the first communication protocol is a short-range wireless communication protocol; and
   wherein the second communication protocol is a long-range wireless communication protocol.

6. The image processing apparatus of claim 1, wherein the steps of transmitting the connection information, establishing the connection using the second communication device, receiving the image processing data through the second communication device and executing the image processing are performed automatically in response to determining that the setting value is compatible with the image processing apparatus and without requiring intervening user input.

7. The image processing apparatus of claim 1, wherein the first communication device and the second communication device are parts of a single communication unit.

8. The image processing apparatus of claim 1, wherein establishing the connection with the information processing apparatus through the second communication device using the second communication protocol includes disconnecting a connection with the information processing apparatus established through the first communication device.

9. The image processing apparatus of claim 1, wherein the computer readable instructions, when executed, further cause the image processing apparatus to:
   determine that the image processing based on the image processing data has been completed; and
   disconnect the connection with the information processing apparatus established through the second communication device using the second communication protocol in response to determining that the image processing has been completed.

10. An information processing apparatus comprising:
    a first communication device configured to process communications according to a first communication protocol;
    a second communication device configured to process communications according to a second communication protocol;
    a processor; and
    memory storing computer readable instructions that, when executed, cause the information processing apparatus to:
    transmit, to an image processing apparatus through the first communication device, information relating to an image processing function including a setting value for the image processing function;
    receive a connection approval message or a connection disapproval message after transmitting the setting value for the image processing function to the image processing apparatus;
    in response to receiving the connection approval message:
       determine connection information required for establishing communications with the image processing apparatus using the second communication protocol, the connection information being received with or after the connection approval message;
       establish, through the second communication device, a communication connection with the image processing apparatus using the connection information; and
       request, through the second communication device using the second communication protocol, image processing by the image processing apparatus; and in response to receiving the connection disapproval message, not establishing the communication with the image processing apparatus through the second communication device and not requesting the image processing by the image processing apparatus.

11. The information processing apparatus of claim 10, wherein the connection disapproval message indicates that the setting value is incompatible with the image processing apparatus.

12. The information processing apparatus of claim 10, wherein the computer readable instructions, when executed, further cause the information processing apparatus to display a reason for connection disapproval on a display of the information processing apparatus upon receiving the connection disapproval message.

13. The information processing apparatus of claim 10, wherein the setting value corresponds to a usage limit number of the image processing function.

14. The information processing apparatus of claim 10, wherein establishing the communications with the image processing apparatus through the second communication device and requesting the image processing by the image processing apparatus are performed automatically and without requiring intervening user input in response to receiving the connection approval message and the connection information from the image processing apparatus.

15. The information processing apparatus of claim 10, wherein the first communication protocol is a short-range wireless communication protocol; and
wherein the second communication protocol is a long-range wireless communication protocol.

16. The information processing apparatus of claim 10, wherein the first communication device and the second communication device are parts of a single communication unit.

17. The information processing apparatus of claim 10, wherein establishing the connection with the image processing apparatus through the second communication device using the second communication protocol includes disconnecting a connection with the image processing apparatus established through the first communication device.

18. The information processing apparatus of claim 10, wherein the computer readable instructions, when executed, further cause the information processing apparatus to:
receive an image processing completion message from the image processing apparatus; and
in response to receiving the image processing completion message, disconnect the communication connection established through the second communication device.

19. The information processing device of claim 10, wherein the computer readable instructions, when executed, further cause the information processing apparatus to:
display the setting value for the image processing function; and
generate print data based on the displayed setting value,
wherein transmitting the information to the image processing apparatus includes transmitting the displayed setting value, and
wherein requesting the image processing includes transmitting the generated print data.

20. The information processing device of claim 10, wherein the computer readable instructions, when executed, further cause the information processing apparatus to:
determine that a printing completion response corresponding to the image processing has been received from the image processing apparatus; and
disconnect the connection with the image processing apparatus established through the second communication device using the second communication protocol in response to determining that the printing completion response has been received.

21. A method comprising:
receiving, by an image processing apparatus, communication from an information processing apparatus through a first communication device using a first communication protocol, the communication relating to an image processing function and including a setting value for the image processing function;
determining whether the setting value is compatible with the image processing apparatus;
in response to determining that the setting value is compatible with the image processing apparatus:
transmitting, to the information processing apparatus, connection information required to establish communication with the image processing apparatus through a second communication device using a second communication protocol;
establishing, by the image processing apparatus, a connection with the information processing apparatus through the second communication device using the second communication protocol;
receiving, by the image processing apparatus, data for the image processing from the information processing apparatus through the second communication device using the second communication protocol; and
executing, by the image processing apparatus, the image processing in accordance with the image processing instruction.

22. The method of claim 21, wherein transmitting the connection information, establishing the connection using the second communication device, receiving the image processing data through the second communication device and executing the image processing are performed automatically and without requiring user input.

* * * * *